United States Patent [19]

Smeltzer et al.

[11] Patent Number: 4,662,059
[45] Date of Patent: May 5, 1987

[54] METHOD OF MAKING STABILIZED SILICON-ON-INSULATOR FIELD-EFFECT TRANSISTORS HAVING 100 ORIENTED SIDE AND TOP SURFACES

[75] Inventors: Ronald K. Smeltzer, Mercer County, N.J.; Wesley H. Morris, Fort Pierce, Fla.

[73] Assignee: RCA Corporation, Princeton, N.J.

[21] Appl. No.: 777,584

[22] Filed: Sep. 19, 1985

[51] Int. Cl.[4] .................... H01L 21/36; H01L 21/308
[52] U.S. Cl. ........................................ 29/571; 29/578; 156/646; 156/647; 156/651; 148/DIG. 115
[58] Field of Search ............... 156/643, 646, 647, 649, 156/651; 29/571, 578; 357/56, 60; 148/DIG. 115

[56] References Cited

U.S. PATENT DOCUMENTS

| | | | |
|---|---|---|---|
| 3,890,632 | 6/1975 | Ham et al. | 357/23 |
| 4,241,359 | 12/1980 | Izumi et al. | 357/49 |
| 4,255,230 | 3/1981 | Zajac | 156/643 |
| 4,278,987 | 7/1981 | Imaizumi et al. | 357/48 |
| 4,426,246 | 1/1984 | Kravitz et al. | 156/643 |
| 4,496,418 | 1/1985 | Ham | 156/643 |

FOREIGN PATENT DOCUMENTS

| | | | |
|---|---|---|---|
| 0060061 | 5/1981 | Japan | 357/60 |
| 0004164 | 1/1982 | Japan | 156/649 |

OTHER PUBLICATIONS

"MOS C-t Evaluation of Reactive Ion Etched Silicon Substrate" by Y. Ozaki et al., *Japanese Journal of Applied Physics*, vol. 23, Nov. 1984, pp. 1526-1531.
"Study of Breakdown Fields of Oxides Grown on Reactive Ion Etched Silicon Surface: Improvement of Breakdown Limits by Oxidation of the Surface", N. Lifshitz, *Journal Electrochemical Society: Solid-State Science and Technology*, Jul. 1983, pp. 1549-1550.
"Radiation-Hard 16K CMOS/SOS Clocked Static Ram" by A. Gupta et al. *IEDM 81*, pp. 616-619 (1981).
"Plasma Deposition and Etching Reactors for Semiconductor Applications" by J. Vossen, *Pure and Applied Chemistry*, vol. 52, (1980), pp. 1759-1765.
"Reactive Ion Etching of Silicon with Cl$_2$/AR(1)" by H. B. Pogge et al., *Journal Electrochemical Society: Solid-State Science and Technology*, Jul. 1983, pp. 1592-1597.

*Primary Examiner*—Olik Chaudhuri
*Attorney, Agent, or Firm*—Birgit E. Morris; Donald S. Cohen; Bernard F. Plantz

[57] ABSTRACT

A MOS/SOI field-effect transistor is made by applying a layer of a photoresist over the surface of a single-crystalline silicon layer which is on a substrate of an insulating material, such as sapphire. The surface of the silicon layer is along a (100) crystallographic plane. The photoresist layer is defined to provide an area of the photoresist layer over the area of the silicon layer where the transistor is to be formed with the edges of the photoresist area being along the edges of (100) crystallographic planes which are perpendicular to the surface of the silicon layer. The portion of the silicon layer around the photoresist layer is etched with an anisotropic plasma etch which etches the silicon layer along the (100) crystallographic planes which are perpendicular to the surface of the silicon layer to form an island of the silicon. The etching is achieved by a two step process in which the first step etches part way through the silicon layer and the second step etches completely through with an overetch. This forms the silicon island with sides which extend along (100) crystallographic planes substantially perpendicular to the top surface and which are smooth, undamaged and have rounded edges with the top surface. After removing the photoresist, a MOS field-effect transistor is formed on the island.

9 Claims, 7 Drawing Figures

METHOD OF MAKING STABILIZED SILICON-ON-INSULATOR FIELD-EFFECT TRANSISTORS HAVING 100 ORIENTED SIDE AND TOP SURFACES

The present invention relates to a method of making silicon-on-insulator (SOI) MOS field-effect transistors. More particularly, the present invention relates to a method of making MOS/SOI transistors which are stabile with regard to parasitic sidewall leakage, particularly when the device has been subject to radiation.

BACKGROUND OF THE INVENTION

MOS/SOI transistors are formed in islands of single-crystalline silicon on a substrate of insulating material, such as sapphire, with each island containing a single MOS transistor. The transistors are formed by epitaxially depositing a layer of single-crystalline silicon on the insulating substrate. A layer of silicon oxide is formed on the silicon layer. A layer of photoresist is coated over the silicon oxide layer and is defined, using standard photolithographic techniques, to leave portions of the photoresist over those areas of the silicon layer which are to remain. The uncovered portions of the silicon oxide layer and the portions of the silicon layer thereunder are then removed using a suitable etchant. A gate oxide is formed on the surface of each island, a conductive gate is formed over the gate oxide and source and drain regions are formed in the island either by diffusion or by ion implantation.

The silicon island is generally deposited on the (1102) oriented surface of the sapphire substrate so that the surface of the silicon layer has a (100) crystallographic orientation. Early in the development of SOI technology the island was formed by etching with potassium hydroxide using the slow etching (111) plane as the boundaries of the island. These (111) boundary sides sloped away from the top surface of the island. When forming a N-channel MOS transistor in such an island, the channel oxide and gate extended across not only the (100) top surface, but also across two opposed (111) boundary or side surfaces. This type of transistor was unstable because it had excessive edge leakage which resulted from the fact that an N-channel transistor formed along the (111) side surfaces of the island had a threshold voltage lower than that of a transistor formed along the (100) top surface. One attempt to overcome this problem was to make the channel regions of the transistors along the edge surfaces less conductive by implanting more conductivity modifiers in the side edges, as described in U.S. Pat. No. 3,890,632 to W. E. Ham et al., issued June 17, 1975, entitled "Stabilized Semiconductor Devices And Method of Making The Same". With the advent of reactive ion etching it became possible to etch vertically into a body of semiconductor material, i.e. perpendicular to the surface of the body. SOI islands were then formed with the side walls being vertical and extending along the (110) plane. These vertical side walls made the SOI/MOS transistor more stable, particularly when the transistors were subjected to high degrees of radiation. However, even greater stability would be desirable.

SUMMARY OF THE INVENTION

A method of making a silicon-on-insulator MOS field-effect transistor includes the steps of providing a photoresist layer over the surface of a layer of single-crystalline silicon which is on an insulating substrate with the surface of the silicon layer extending along the (100) crystallographic plane. The photoresist layer is defined to provide at least one area which has its edges extending along the edges of (100) crystallographic planes of the silicon layer which are perpendicular to the surface of the silicon layer with portions of the silicon surface around the edges of the photoresist area being exposed. The exposed portions of the silicon layer are then etched by an anisotropic plasma etch which etches along the (100) crystallographic plane of the silicon layer which are perpendicular to the surface of the silicon layer to form an island of silicon the sides of which extend along (100) crystallographic planes substantially perpendicular to the top surface of the island and which are substantially smooth and undamaged and which has a rounded edge between the sides and the top surface of the island.

DETAILED DESCRIPTION OF PREFERRED EMBODIMENT

We have discovered that the stability of a SOI/MOS transistor can be improved by making the transistor with the boundary or side surfaces of the silicon island extending along a (100) crystallographic plane which is substantially perpendicular to the top surface of the island, and being smooth and undamaged with a rounded edge between the side surface and the top surface of the island. The effect of silicon crystallographic orientation on the characteristics of a MOS transistor is shown in the following table:

| ORIENTATION | BOND DENSITY × $10^{14}$/cm$^2$ | SURFACE ENERGY × $10^{14}$ eV/cm$^2$ | Si/SiO$_2$ FIXED CHARGE DENSITY × $10^{11}$/cm$^2$ | Si/SiO$_2$ INTERFACE TRAP DENSITY × $10^{11}$/cm$^2$ × eV$^{-1}$ |
|---|---|---|---|---|
| (100) | 6.8 | 13.3 | 2 | 0.5 |
| (110) | 9.4 | 9.4 | 4 | 3 |
| (111) | 11.8 | 7.6 | 6 | 4 |

It can be seen from this table that the (100) oriented surface provides better transistor characteristics than either the (111) or (110) oriented surface. Thus, by having the side surface of the silicon islands along the (100) orientation, not only are the characteristics of the transistors formed along the side surfaces improved, but the transistor characteristics are uniform across the entire island which also has a (100) oriented top surface.

Figure 1:
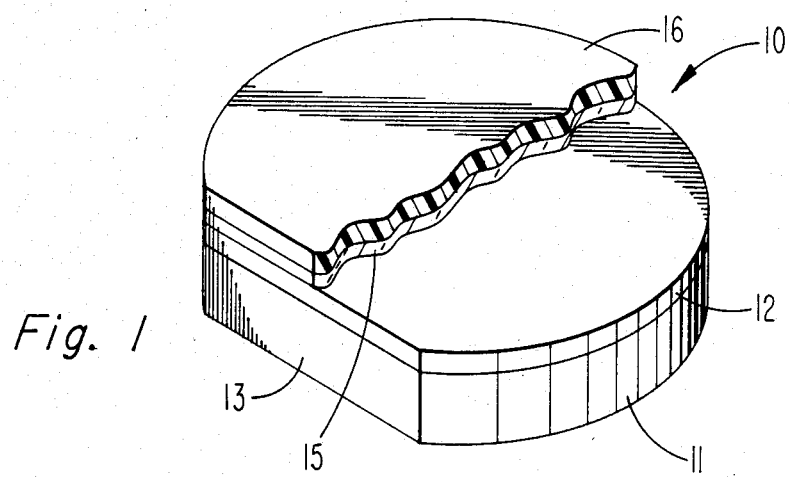
FIG. 1 is a perspective view of an SOI substrate which is used to carry out the method of the present invention.
Figure 2:
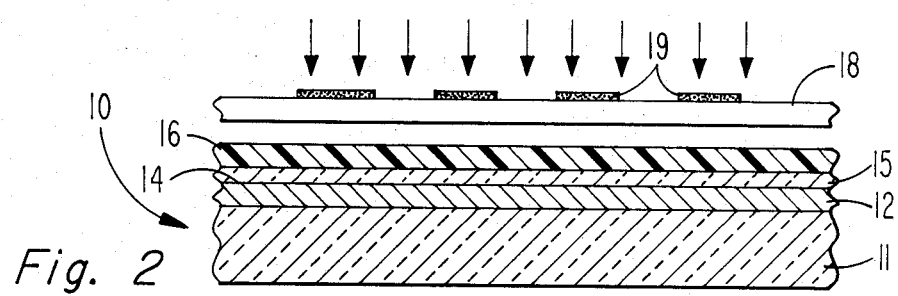
FIGS. 2, 3 and 4 are sectional views illustrating the steps of the present invention for forming silicon islands in the SOI substrate.
Figure 3:
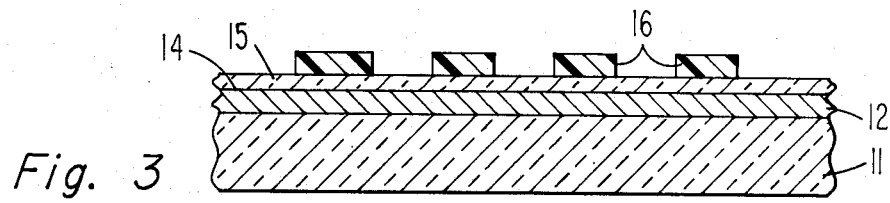

To form the SOI/MOS transistor with the side surfaces of the silicon island being along the (100) crystallographic plane, one starts with a wafer 10 of a substrate 11 of insulating material, such as sapphire, having a layer 12 of single-crystal silicon on a surface thereof as shown in FIG. 1. The silicon layer 12 has its surface 14 extending along the (100) crystallographic plane. A layer 15 of silicon oxide is provided on the silicon layer surface 14, such as by heating the silicon layer 12 in an oxidizing atmosphere. As shown in FIG. 2, a layer 16 of a photoresist is coated on the silicon oxide layer 15. A mask 18 is placed over the photoresist layer 16. For a positive type photoresist, the mask 18 has spaced opaque areas 19 of the desired shape of the silicon islands to be formed. The mask 18 is positioned with respect to the silicon layer 12 such that the edges of the opaque areas 19 extend along the edges of the (100) crystallographic planes which are perpendicular to the surface 14 of the silicon layer 12.

The relationship between the mask 18 and the silicon layer 12 can be achieved in one of several ways. Commercial sapphire substrates 10 have an orientation flat 13 along their edge which extends parallel to the (110) crystallographic planes in the silicon layer 12 which are perpendicular to the surface 14 of the silicon layer 12 as shown in FIG. 1. The mask 18 is mounted over the photoresist layer 16 with a side edge of the opaque area 19 being parallel to the orientation flat 13. The wafer 10 and mask 18 are then rotated with respect to each other, either by rotating the wafer 10 or the mask 18 for 45°. This places the side edge of the opaque area 19 parallel to the edge of the (100) crystallographic planes in the silicon layer 12 which are perpendicular to the silicon layer surface 14. Alternatively, the sapphire substrate 11 can be initially provided with a flat 13 45° from the R-plane, perpendicular to the C-axis projection so that when the silicon layer 12 is heteroepitaxially deposited on the surface of the sapphire substrate 11, the alignment flat 13 will be parallel to the (100) crystallographic plane in the silicon layer 12 which is perpendicular to the silicon layer surface 14. The mask can then be directly aligned to the substrate flat 13.

Figure 4:
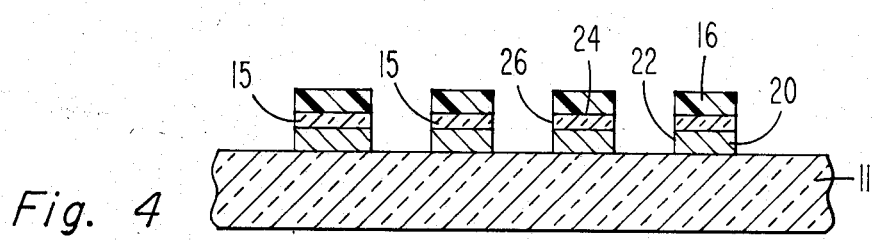

Light is then directed through the transparent portions of the mask 18 onto the photoresist layer 16 to expose the area of the photoresist layer 16 not covered by the opaque areas 19 of the mask 18. The exposed area of the photoresist layer 16 is developed to remove such area and expose a portion of the silicon oxide layer 15 which is on a corresponding area of the surface 14 of the silicon layer 12. This leaves areas of the photoresist layer 16 over the areas of the silicon layer surface 14 where the islands of silicon are to be formed. The edges of the remaining areas of the photoresist layer 16 extend along the edges of (100) crystallographic planes which are perpendicular to the silicon layer surface 14. The exposed area of the silicon oxide layer 15 and then the underlying area of the silicon layer 12 are then etched by an anisotropic plasma etch to etch the silicon layer 12 perpendicular to its surface 14 along the (100) crystallographic plane which is perpendicular to the silicon layer surface 14. This provides silicon islands 20 having sides 22 which are substantially perpendicular to the top surface 24 of the island and extend along the (100) crystallographic plane as shown in FIG. 4. The anisotropic plasma etch must not only provide the island sides 22 which are perpendicular to the top surface 24 and extend along the (100) crystallographic plane but also the island sides 22 must be smooth and undamaged and the corners 26 between the sides 22 and top surface 24 must be rounded. This can be achieved by the anisotropic plasma etch of the present invention. The plasma etch can be carried out in a conventional apparatus, such as that described by Vossen in an article entitled "Plasma Deposition and Etching Reactors For Semiconductor Applications", published in *Pure and Applied Chemistry*, Volume 52, pp. 1759–1765 (1980).

Figure 5:
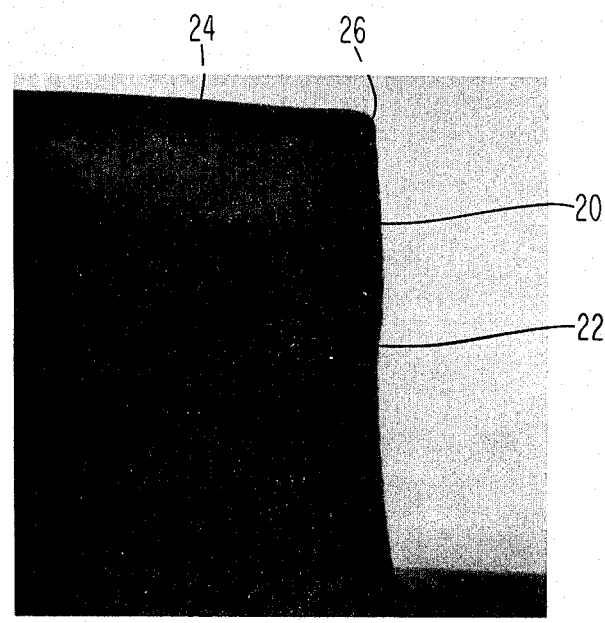
FIG. 5 is a microphotograph of a portion of a silicon island formed by the method of the present invention.

The anisotropic plasma etch of the present invention is a two step process. The wafer 10 is placed in the reactor, which is a Hex plasma reactor. With the reactor at a pressure of 10 mtorr±2 mtorr and a RF voltage of between 1100 and 1300 watts, preferably 1200 watts, applied between the plates of the reactor, a flow of 35 cc to 65 cc, preferably 50 cc, per minute of nitrogen ($N_2$), 5 cc to 15 cc, preferably 10 cc, per minute of chlorine ($Cl_2$) and 15 cc to 25 cc, preferably 20 cc per minute of boron trichloride ($BCl_3$) is provided into the reactor. The silicon is subjected to this etch for about 1 minute±15 seconds. The reactor is then purged with nitrogen to remove the reactor gases of the first step. For the second step, the reactor is at a pressure of 15 mtorr±5 mtorr, a RF voltage of 600 to 1000 watts, preferably 800 watts, is provided across the plates and a flow of 35 cc±10 cc per minute of chlorine ($Cl_2$) is provided in the reactor. The second step is carried out until the silicon is removed down to the surface of the substrate and then for an additional time to achieve a 20% to 35% overetch. As shown by the microphotograph of FIG. 5, this provides a silicon island having a side wall which is substantially perpendicular to the top surface and which is smooth and undamaged. Also there is a rounded edge between the side and the top surface. The photoresist 16 is then removed with a suitable solvent and the silicon oxide layer 25 is removed with a suitable etchant, such as buffered hydrofluoric acid.

Figure 6:
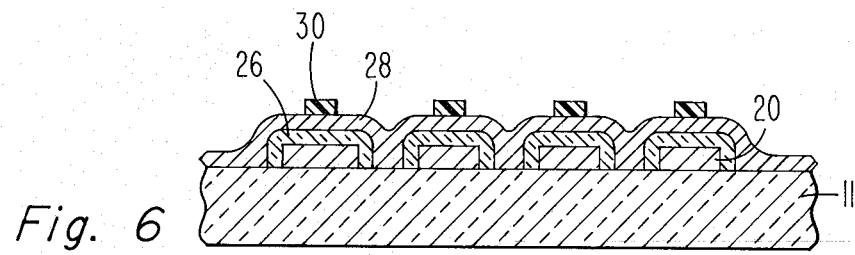
FIGS. 6 and 7 are sectional views illustrating the steps of the method of the present invention for forming MOS transistors in the islands.
Figure 7:
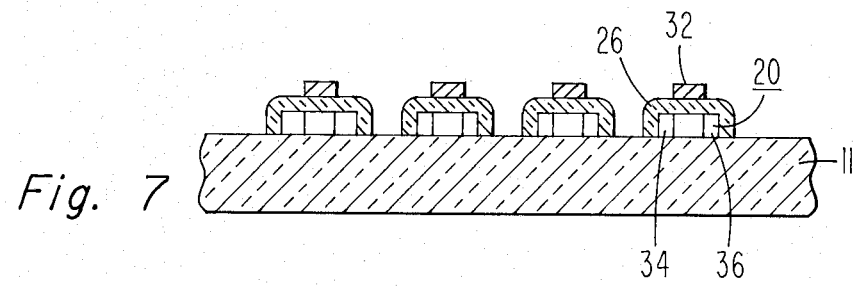

MOS field-effect transistors are then formed in the silicon islands 20 as is well known in the art. For example, as shown in FIG. 6, a thin layer 26 of silicon oxide can be formed on the surface of the islands 20 by heating the islands in an atmosphere of water vapor at about 900° C. This is carried out for a time sufficient to achieve a silicon oxide layer 26 of the thickness desired for the channel oxide of the transistor. A layer 28 of polycrystalline silicon can then be deposited over the silicon oxide layer 26 by exposing the wafer 10 to an atmosphere of silane at a temperature of about 600° C. The polycrystalline silicon layer 28 is then doped with phosphorus, either by ion implantation or by exposure to $POCl_3$, to make it conductive. A layer 30 of a photoresist is applied over the polycrystalline silicon layer 28. Using standard photolithographic techniques, the photoresist layer 30 is defined to cover strips of the polycrystalline silicon layer 28 which extend across the islands 20 to form gate lines 32. The exposed portions of the polycrystalline silicon layer 28 are then etched away leaving the gate lines 32 as shown in FIG. 7. Conductivity modifiers of the appropriate type are then implanted into the silicon island 20 at each side of the gate lines 32 to form the source and drain regions 34 and 36 of the transistor. The conductivity modifiers are also implanted into the gate lines 32.

To measure the device improvement made by the method of the present invention, a group of silicon-on-sapphire MOS field-effect transistors were made by the method of the present invention with the sides of the silicon islands being along a (100) crystallographic plane and a group of control silicon-on-sapphire field-effect transistors were made by a method substantially the same as that of the present invention except that the sides of the silicon islands extended along (110) crystallographic planes. Each device included P-type MOS transistors and N-type MOS transistors which were electrically connected in a standard inverter circuit. Testing the individual transistors and the circuits revealed a clear tendency for devices made in accordance with the present invention to have a superior dielectric integrity as measured by pre-breakdown gate leakage currents over the control devices. Although no difference was seen in the voltage at which destructive breakdown occurred between the devices of the present invention and the control devices, array gate leakage currents were an order of magnitude smaller in the devices of the present invention over the control devices. When the devices were subject to doses of radiation, it was found that, at zero bias, leakage currents in the devices of the present invention were about a factor of five smaller than the control devices at high radiation doses, gamma radiation from a $Co^{60}$ source at a total dose of $10^5$ rads (Si). These results indicated that the devices did not include a parasitic transistor as did the control devices since the sides of the islands extend along the same crystallographic plane as the top surface of the island. In addition, the smooth, undamaged sides of the islands and the rounded edge between the sides and the top surface of the islands provide for a channel oxide having good dielectric integrity across the entire channel.

We claim:

1. In a method of making a silicon-on-insulator MOS field-effect transistor, the steps of
   (a) providing a photoresist layer over the surface of a layer of single-crystalline silicon which is on an insulating substrate, which surface extends along a (100) crystallographic plane,
   (b) defining said photoresist layer to provide at least one area which has its edges extending along the edges of (100) crystallographic planes of the silicon layer which are perpendicular to the surface of the silicon layer with portions of the silicon surface being exposed around the edges of said photoresist area, and
   (c) etching the exposed portion of the silicon layer by an anisotropic plasma etch which etches along the (100) crystallographic planes of the silicon layer which are perpendicular to the surface of the silicon layer to form an island of silicon, the sides of which extend along (100) crystallographic planes substantially perpendicular to the top surface of the island and which are substantially smooth and undamaged and have rounded edges between the sides and the top surface.

2. A method in accordance with claim 1 wherein the silicon layer is anistropically etched in a plasma first in an atmosphere of nitrogen, chlorine and boron trichloride for a time period to etch at least part way through the silicon layer and secondly in an atmosphere of only chlorine for a time period to etch completely through the silicon layer and for an additional time to overetch the sides of the islands.

3. A method in accordance with claim 2 wherein the first etch step is carried out at a pressure of 10 mtorr±2 mtorr, an RF voltage between the plates of the plasma reactor of 1200 watts±100 watts, and a flow of 35 cc to 65 cc per minute of the nitrogen, 8 cc to 15 cc per minute of the chlorine and 15 cc to 25 cc per minute of the boron trichloride.

4. A method in accordance with claim 3 wherein the second etch step is carried out at a pressure of 15 mtorr±5 mtorr, an RF voltage between the plates of the plasma reactor of 600 to 1000 watts and a flow of 35 cc±10 cc per minute of the chlorine.

5. A method in accordance with claim 4 including the step of purging the atmosphere in which the etch steps are carried out with nitrogen between the two etch steps.

6. A method in accordance with claim 5 where in the first step a flow of 50 cc per minute of nitrogen, 10 cc per minute of chlorine and 20 cc per minute of boron chloride is used and in the second step a flow of 35 cc per minute of chlorine is used.

7. A method in accordance with claim 1 wherein the insulating substrate has a flat along one edge which is parallel to the (110) crystallographic planes in the silicon layer which are perpendicular to the surface of the silicon layer, and the photoresist layer is defined by placing a mask having an opaque area corresponding in shape and size to the silicon island to be formed over the photoresist layer, with a side of the opaque area parallel to the flat on the insulating substrate, rotating the mask with respect to the silicon layer through 45°, and then exposing and developing the photoresist layer.

8. A method in accordance with claim 1 wherein the insulating substrate has a flat along one edge which is parallel to the (100) crystallographic planes in the silicon layer which are perpendicular to the surface of the silicon layer, and the photoresist layer is defined by placing a mask having an opaque area corresponding in shape and size to the silicon island to be formed over the photoresist layer with an edge of the opaque area parallel to the flat on the insulating substrate and exposing and developing the photoresist layer.

9. A method in accordance with claim 1 wherein after etching the silicon layer to form the island performing the additional steps of
   (d) removing the photoresist from the top surface of the island,
   (e) forming a thin layer of silicon oxide on the top and side surface of the island,
   (f) forming a conductive gate on the silicon oxide layer which extends across a portion of the top surface of the island and at least one side, and
   (g) forming source and drain regions in the island at opposite sides of the gate.

* * * * *